(12) United States Patent
Tetsuyama

(10) Patent No.: US 12,525,491 B2
(45) Date of Patent: Jan. 13, 2026

(54) METHOD OF MEASURING RESISTIVITY, METHOD OF MANUFACTURING SEMICONDUCTOR DEVICE, RECORDING MEDIUM, AND RESISTIVITY MEASURING DEVICE

(71) Applicant: KOKUSAI ELECTRIC SEMICONDUCTOR SERVICE INC., Toyama (JP)

(72) Inventor: Chihiro Tetsuyama, Toyama (JP)

(73) Assignee: KOKUSAI ELECTRIC SEMICONDUCTOR SERVICE INC., Toyama (JP)

( * ) Notice: Subject to any disclaimer, the term of this patent is extended or adjusted under 35 U.S.C. 154(b) by 845 days.

(21) Appl. No.: 17/846,924

(22) Filed: Jun. 22, 2022

(65) Prior Publication Data

US 2022/0319935 A1    Oct. 6, 2022

Related U.S. Application Data

(63) Continuation of application No. PCT/JP2020/048497, filed on Dec. 24, 2020.

(30) Foreign Application Priority Data

Dec. 26, 2019   (JP) ................. 2019-236577

(51) Int. Cl.
*H01L 21/66* (2006.01)
*H01L 21/67* (2006.01)

(52) U.S. Cl.
CPC ........ *H01L 22/14* (2013.01); *H01L 21/67253* (2013.01); *H01L 21/67276* (2013.01)

(58) Field of Classification Search
CPC .... G01R 27/02; G01R 27/14; G01R 31/2648; G01R 31/2812; G01R 31/2831;

(Continued)

(56) References Cited

U.S. PATENT DOCUMENTS

2005/0234672 A1* 10/2005 Takahashi ............ G01N 23/225
                                                               702/95
2018/0203089 A1*  7/2018 Xu .......................... C09G 1/02

FOREIGN PATENT DOCUMENTS

JP            4-152280 A     5/1992
JP       2005-302906 A    10/2005
                (Continued)

OTHER PUBLICATIONS

Espacenet English translation JP 2013153021 A (Year: 2013).*
International Search Report with English Translation, PCT/JP2020/048497, Mar. 16, 2021 (5 pgs).
Japanese Office Action issued on Feb. 7, 2023 for Japanese Patent Application No. 2021-567625.

(Continued)

*Primary Examiner* — Eman A Alkafawi
*Assistant Examiner* — Courtney G Mcdonnough
(74) *Attorney, Agent, or Firm* — Volpe Koenig

(57) ABSTRACT

There is provided a technique that includes (a) receiving a recipe for measuring an object to be measured; (b) calculating an estimated time when measuring the object according to a setting order of respective measurement points set in the recipe; (c) changing the setting order of the respective measurement points set in the recipe according to a measurement pattern for measuring the object and calculating an estimated time when measuring the object according to the changed setting order; (d) selecting the setting order in which the estimated time is the shortest among the estimated times calculated in (b) and (c); and (e) measuring the object in the selected setting order.

16 Claims, 17 Drawing Sheets

(58) Field of Classification Search
CPC ............ G01R 31/2848; G01R 31/2853; G01R 1/06705; G01R 1/06744; G01R 1/06794; G01R 1/07307; G01R 1/07314; G01R 1/07342; G01R 1/07364; G01R 27/025; G01R 27/08; G01R 27/16; G01R 3/00; G01R 31/2601; G01R 31/2889; G01R 31/2891; H01L 21/67253; H01L 21/67276; H01L 22/14; H01L 22/20; H01L 21/66; H01L 22/00; C09K 11/7734; G01B 7/06; G01V 3/30; G01V 99/00; G01V 3/00; G01V 8/00; G01V 11/00; G01V 20/00; G01N 19/00; G01N 22/00; G01N 9/00; G01N 21/00; G01N 27/00; G01N 23/225; G01N 23/20; G05B 19/182; G06T 2207/30148; G06T 7/0004; G06Q 10/047; H01J 2237/2487; H01J 2237/2817; H05K 2201/09972; H05K 3/0008; H05K 3/0047

See application file for complete search history.

(56) References Cited

FOREIGN PATENT DOCUMENTS

| JP | 2010-217134 A | 9/2010 | |
| JP | 2013153021 A * | 8/2013 | ............. H01L 21/66 |

OTHER PUBLICATIONS

Korean Office Action issued on Jun. 21, 2024 for Korean Patent Application No. 10-2022-7020864.

* cited by examiner

| Setting order | Radius (mm) | Angle (degrees) |
| --- | --- | --- |
| 1 | 0 | 0 |
| 2 | 60 | 60 |
| 3 | 80 | 30 |
| 4 | 80 | 90 |
| 5 | 80 | 180 |
| 6 | 100 | 330 |
| 7 | 100 | 30 |
| 8 | 140 | 10 |
| 9 | 140 | 290 |

| Setting order | Radius (mm) | Angle (degrees) | Measurement order |
|---|---|---|---|
| 1 | 0 | 0 | 1 |
| 2 | 60 | 60 | 2 |
| 4 | 80 | 90 | 3 |
| 5 | 80 | 180 | 4 |
| 3 | 80 | 30 | 5 |
| 7 | 100 | 30 | 6 |
| 6 | 100 | 330 | 7 |
| 8 | 140 | 10 | 8 |
| 9 | 140 | 290 | 9 |

| Setting order | Radius (mm) | Angle (degrees) | Measurement order |
|---|---|---|---|
| 1 | 0 | 0 | 1 |
| 8 | 140 | 10 | 2 |
| 7 | 100 | 30 | 3 |
| 3 | 80 | 30 | 4 |
| 2 | 60 | 60 | 5 |
| 4 | 80 | 90 | 6 |
| 5 | 80 | 180 | 7 |
| 9 | 140 | 290 | 8 |
| 6 | 100 | 330 | 9 |

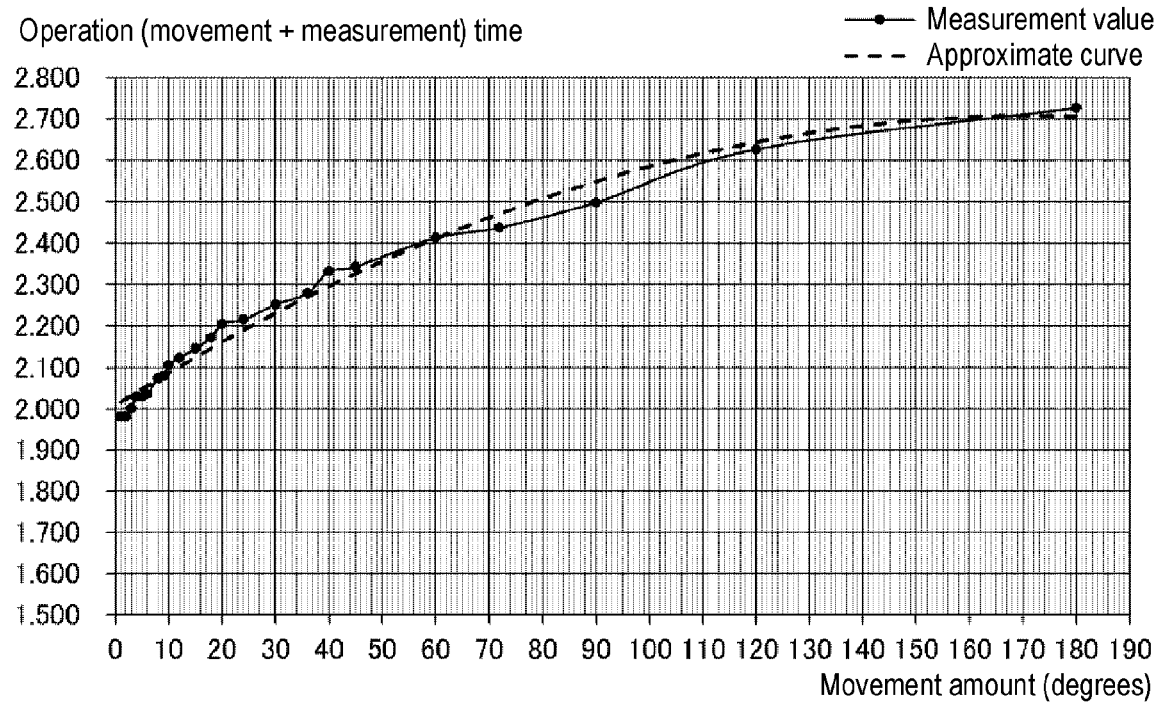

FIG. 13C

| Setting order | Radius (mm) | Angle (degrees) | Measurement order |
|---|---|---|---|
| 1 | 10 | 0 | 1 |
| 5 | 10 | 45 | 2 |
| 3 | 140 | 45 | 3 |
| 2 | 100 | 180 | 4 |
| 4 | 100 | 225 | 5 |

FIG. 14

| Setting order | Radius (mm) | Angle (degrees) |
|---|---|---|
| 1 | 0 | 0 |
| 2 | 74.5 | 45 |
| 3 | 74.5 | 90 |
| 4 | 74.5 | 135 |
| 5 | 74.5 | 180 |
| 6 | 74.5 | 225 |
| 7 | 74.5 | 270 |
| 8 | 74.5 | 315 |
| 9 | 74.5 | 0 |
| 10 | 145 | 45 |
| 11 | 145 | 67.5 |
| 12 | 145 | 112.5 |
| 13 | 145 | 135 |
| 14 | 145 | 157.5 |
| 15 | 145 | 202.5 |
| 16 | 145 | 225 |
| 17 | 145 | 247.5 |

FIG. 15

| Setting order | Radius (mm) | Angle (degrees) | Movement amount (radius) | Movement amount (angle) | Time (radius) | Time (angle) | Time (s) |
|---|---|---|---|---|---|---|---|
| 1 | 0 | 0 | - | - | - | - | - |
| 2 | 74.5 | 45 | 74.5 | 45 | 0.424799 | 0.324 | 0.424799 |
| 3 | 74.5 | 90 | 0 | 45 | 0 | 0.324 | 0.324 |
| 4 | 74.5 | 135 | 0 | 45 | 0 | 0.324 | 0.324 |
| 5 | 74.5 | 180 | 0 | 45 | 0 | 0.324 | 0.324 |
| 6 | 74.5 | 225 | 0 | 45 | 0 | 0.324 | 0.324 |
| 7 | 74.5 | 270 | 0 | 45 | 0 | 0.324 | 0.324 |
| 8 | 74.5 | 315 | 0 | 45 | 0 | 0.324 | 0.324 |
| 9 | 74.5 | 0 | 0 | 45 | 0 | 0.324 | 0.324 |
| 10 | 145 | 45 | 74.5 | 45 | 0.424799 | 0.324 | 0.424799 |
| 11 | 145 | 67.5 | 0 | 22.5 | 0 | 0.172125 | 0.172125 |
| 12 | 145 | 112.5 | 0 | 45 | 0 | 0.324 | 0.324 |
| 13 | 145 | 135 | 0 | 22.5 | 0 | 0.172125 | 0.172125 |
| 14 | 145 | 157.5 | 0 | 22.5 | 0 | 0.172125 | 0.172125 |
| 15 | 145 | 202.5 | 0 | 45 | 0 | 0.324 | 0.324 |
| 16 | 145 | 225 | 0 | 22.5 | 0 | 0.172125 | 0.172125 |
| 17 | 145 | 247.5 | 0 | 22.5 | 0 | 0.172125 | 0.172125 |

FIG. 16

| Setting order | Radius (mm) | Angle (degrees) | Measurement order | Movement amount (radius) | Movement amount (angle) | Time (radius) | Time (angle) | Time (s) |
|---|---|---|---|---|---|---|---|---|
| 1 | 0 | 0 | 1 | - | - | - | - | - |
| 9 | 74.5 | 0 | 2 | 74.5 | 0 | 0.424799 | 0 | 0.424799 |
| 2 | 74.5 | 45 | 3 | 0 | 45 | 0 | 0.324 | 0.324 |
| 3 | 74.5 | 90 | 4 | 0 | 45 | 0 | 0.324 | 0.324 |
| 4 | 74.5 | 135 | 5 | 0 | 45 | 0 | 0.324 | 0.324 |
| 5 | 74.5 | 180 | 6 | 0 | 45 | 0 | 0.324 | 0.324 |
| 6 | 74.5 | 225 | 7 | 0 | 45 | 0 | 0.324 | 0.324 |
| 7 | 74.5 | 270 | 8 | 0 | 45 | 0 | 0.324 | 0.324 |
| 8 | 74.5 | 315 | 9 | 0 | 45 | 0 | 0.324 | 0.324 |
| 17 | 145 | 247.5 | 10 | 74.5 | 67.5 | 0.424799 | 0.455625 | 0.455625 |
| 10 | 145 | 45 | 11 | 0 | 157.5 | 0 | 0.779625 | 0.779625 |
| 11 | 145 | 67.5 | 12 | 0 | 22.5 | 0 | 0.172125 | 0.172125 |
| 12 | 145 | 112.5 | 13 | 0 | 45 | 0 | 0.324 | 0.324 |
| 13 | 145 | 135 | 14 | 0 | 22.5 | 0 | 0.172125 | 0.172125 |
| 14 | 145 | 157.5 | 15 | 0 | 22.5 | 0 | 0.172125 | 0.172125 |
| 15 | 145 | 202.5 | 16 | 0 | 45 | 0 | 0.324 | 0.324 |
| 16 | 145 | 225 | 17 | 0 | 22.5 | 0 | 0.172125 | 0.172125 |

FIG. 17

| Setting order | Radius (mm) | Angle (degrees) | Measurement order | Movement amount (radius) | Movement amount (angle) | Time (radius) | Time (angle) | Time (s) |
|---|---|---|---|---|---|---|---|---|
| 1 | 0 | 0 | 1 | - | - | - | - | - |
| 9 | 74.5 | 0 | 2 | 74.5 | 0 | 0.424799 | 0 | 0.424799 |
| 2 | 74.5 | 45 | 3 | 0 | 45 | 0 | 0.324 | 0.324 |
| 10 | 145 | 45 | 4 | 70.5 | 0 | 0.403119 | 0 | 0.403119 |
| 11 | 145 | 67.5 | 5 | 0 | 22.5 | 0 | 0.172125 | 0.172125 |
| 3 | 74.5 | 90 | 6 | 70.5 | 22.5 | 0.403119 | 0.172125 | 0.403119 |
| 12 | 145 | 112.5 | 7 | 70.5 | 22.5 | 0.403119 | 0.172125 | 0.403119 |
| 13 | 145 | 135 | 8 | 0 | 22.5 | 0 | 0.172125 | 0.172125 |
| 4 | 74.5 | 135 | 9 | 70.5 | 0 | 0.403119 | 0 | 0.403119 |
| 14 | 145 | 157.5 | 10 | 70.5 | 22.5 | 0.403119 | 0.172125 | 0.403119 |
| 5 | 74.5 | 180 | 11 | 70.5 | 22.5 | 0.403119 | 0.172125 | 0.403119 |
| 15 | 145 | 202.5 | 12 | 70.5 | 22.5 | 0.403119 | 0.172125 | 0.403119 |
| 16 | 145 | 225 | 13 | 0 | 22.5 | 0 | 0.172125 | 0.172125 |
| 6 | 74.5 | 225 | 14 | 70.5 | 0 | 0.403119 | 0 | 0.403119 |
| 17 | 145 | 247.5 | 15 | 70.5 | 22.5 | 0.403119 | 0.172125 | 0.403119 |
| 7 | 74.5 | 270 | 16 | 70.5 | 22.5 | 0.403119 | 0.172125 | 0.403119 |
| 8 | 74.5 | 315 | 17 | 0 | 45 | 0 | 0.324 | 0.324 |

FIG. 18

| Setting order | Radius (mm) | Angle (degrees) |
|---|---|---|
| 1 | 0 | 0 |
| 2 | 50 | 30 |
| 3 | 50 | 60 |
| 4 | 100 | 0 |
| 5 | 100 | 45 |
| 6 | 100 | 90 |
| 7 | 100 | 135 |
| 8 | 100 | 180 |
| 9 | 100 | 225 |
| 10 | 100 | 270 |
| 11 | 100 | 315 |
| 12 | 140 | 0 |
| 13 | 140 | 90 |

FIG. 19

| Setting order | Radius (mm) | Angle (degrees) | Movement amount (radius) | Movement amount (angle) | Time (radius) | Time (angle) | Time (s) |
|---|---|---|---|---|---|---|---|
| 1 | 0 | 0 | - | - | - | - | - |
| 2 | 50 | 30 | 50 | 30 | 0.29 | 0.225 | 0.29 |
| 3 | 50 | 60 | 0 | 30 | 0 | 0.225 | 0.225 |
| 4 | 100 | 0 | 50 | 60 | 0.29 | 0.414 | 0.414 |
| 5 | 100 | 45 | 0 | 45 | 0 | 0.324 | 0.324 |
| 6 | 100 | 90 | 0 | 45 | 0 | 0.324 | 0.324 |
| 7 | 100 | 135 | 0 | 45 | 0 | 0.324 | 0.324 |
| 8 | 100 | 180 | 0 | 45 | 0 | 0.324 | 0.324 |
| 9 | 100 | 225 | 0 | 45 | 0 | 0.324 | 0.324 |
| 10 | 100 | 270 | 0 | 45 | 0 | 0.324 | 0.324 |
| 11 | 100 | 315 | 0 | 45 | 0 | 0.324 | 0.324 |
| 12 | 140 | 0 | 40 | 45 | 0.2336 | 0.324 | 0.324 |
| 13 | 140 | 90 | 0 | 90 | 0 | 0.567 | 0.567 |

FIG. 20

| Setting order | Radius (mm) | Angle (degrees) | Measurement order | Movement amount (radius) | Movement amount (angle) | Time (radius) | Time (angle) | Time (s) |
|---|---|---|---|---|---|---|---|---|
| 1 | 0 | 0 | 1 | - | - | - | - | - |
| 2 | 50 | 30 | 2 | 50 | 30 | 0.29 | 0.225 | 0.29 |
| 3 | 50 | 60 | 3 | 0 | 30 | 0 | 0.225 | 0.225 |
| 5 | 100 | 45 | 4 | 50 | 15 | 0.0299 | 0.117 | 0.117 |
| 6 | 100 | 90 | 5 | 0 | 45 | 0 | 0.324 | 0.324 |
| 7 | 100 | 135 | 6 | 0 | 45 | 0 | 0.324 | 0.324 |
| 8 | 100 | 180 | 7 | 0 | 45 | 0 | 0.324 | 0.324 |
| 9 | 100 | 225 | 8 | 0 | 45 | 0 | 0.324 | 0.324 |
| 10 | 100 | 270 | 9 | 0 | 45 | 0 | 0.324 | 0.324 |
| 11 | 100 | 315 | 10 | 0 | 45 | 0 | 0.324 | 0.324 |
| 4 | 100 | 0 | 11 | 0 | 45 | 0 | 0.324 | 0.414 |
| 12 | 140 | 0 | 12 | 40 | 0 | 0.2336 | 0 | 0.2336 |
| 13 | 140 | 90 | 13 | 0 | 90 | 0 | 0.567 | 0.567 |

FIG. 21

| Setting order | Radius (mm) | Angle (degrees) | Measurement order | Movement amount (radius) | Movement amount (angle) | Time (radius) | Time (angle) | Time (s) |
|---|---|---|---|---|---|---|---|---|
| 1 | 0 | 0 | 1 | - | - | - | - | - |
| 4 | 100 | 0 | 2 | 100 | 0 | 0.56 | 0 | 0.56 |
| 12 | 140 | 0 | 3 | 40 | 0 | 0.2336 | 0 | 0.2336 |
| 2 | 50 | 30 | 4 | 90 | 30 | 0.5076 | 0.225 | 0.5076 |
| 5 | 100 | 45 | 5 | 50 | 15 | 0.29 | 0.117 | 0.29 |
| 3 | 50 | 60 | 6 | 50 | 15 | 0.29 | 0.117 | 0.29 |
| 6 | 100 | 90 | 7 | 50 | 30 | 0.29 | 0.117 | 0.29 |
| 13 | 140 | 90 | 8 | 40 | 0 | 0.2336 | 0.225 | 0.2336 |
| 7 | 100 | 135 | 9 | 40 | 45 | 0.2336 | 0 | 0.324 |
| 8 | 100 | 180 | 10 | 0 | 45 | 0 | 0.324 | 0.324 |
| 9 | 100 | 225 | 11 | 0 | 45 | 0 | 0.324 | 0.324 |
| 10 | 100 | 270 | 12 | 0 | 45 | 0 | 0.324 | 0.324 |
| 11 | 100 | 315 | 13 | 0 | 45 | 0 | 0.324 | 0.324 |

METHOD OF MEASURING RESISTIVITY, METHOD OF MANUFACTURING SEMICONDUCTOR DEVICE, RECORDING MEDIUM, AND RESISTIVITY MEASURING DEVICE

CROSS-REFERENCE TO RELATED APPLICATIONS

The application is a Bypass Continuation Application of PCT International Application No. PCT/JP2020/048497, filed on Dec. 24, 2020 and designating the United States, the international application being based upon and claiming the benefit of priority from Japanese Patent Application No. 2019-236577, filed on Dec. 26, 2019, the entire contents of which are incorporated herein by reference.

TECHNICAL FIELD

The present disclosure relates to a method of measuring the resistivity, a method of manufacturing a semiconductor device, a recording medium, and a resistivity measuring device.

BACKGROUND

A resistivity measuring device of a semiconductor wafer, which is a device for measuring a resistivity of a silicon wafer, a resistivity of an epitaxial wafer formed on a wafer surface, a sheet resistance of a diffusion layer or an implantation layer where impurities are diffused or implanted from the surface, a sheet resistance of a metal film generated on the surface, and the like, is an important measuring device for uniformly maintaining the quality of the semiconductor device by feedback of measurement results to a process condition of each semiconductor manufacturing apparatus. Such a measuring device disclosed in the related art describes a four point resistivity measuring device that improves the measurement accuracy of the resistivity of a semiconductor wafer.

SUMMARY

When measuring the resistance value of each point of the semiconductor wafer according to the setting order of a registered recipe, since a stage or an arm of the resistivity measuring device may move unnecessarily depending on a recipe registration method, it may take some time to complete the measurement.

The present disclosure provides a technique capable of shortening the measurement time of the resistivity of a semiconductor wafer.

According to embodiments of the present disclosure, there is provided a technique that includes (a) receiving a recipe for measuring an object to be measured; (b) calculating an estimated time when measuring the object according to a setting order of respective measurement points set in the recipe; (c) changing the setting order of the respective measurement points set in the recipe according to a measurement pattern for measuring the object and calculating an estimated time when measuring the object according to the changed setting order; (d) selecting the setting order in which the estimated time is the shortest among the estimated times calculated in (b) and (c); and (e) measuring the object in the selected setting order.

BRIEF DESCRIPTION OF DRAWINGS

The accompanying drawings, which are incorporated in and constitute a part of the specification, illustrate embodiments of the present disclosure.

FIG. 12B is a diagram showing measured values and their approximate curve with respect to the relationship between the stage movement amount and the measurement time.

FIG. 13A is a diagram showing a recipe example in which the measurement order in the measurement pattern C is set. FIG. 13B is a diagram showing a state in which the recipe of FIG. 13A is rearranged by the measurement pattern B. FIG. 13C is a diagram showing a state in which the recipe of FIG. 13A is rearranged by the measurement pattern C.

FIG. 14 is a diagram showing a recipe example in which a measurement order in the measurement pattern A is selected.

FIG. 15 is a diagram for explaining calculation of an estimated measurement time of the measurement pattern A in the recipe of FIG. 14.

FIG. 16 is a diagram for explaining calculation of an estimated measurement time in which the recipe of FIG. 14 is rearranged by the measurement pattern B.

FIG. 17 is a diagram for explaining calculation of an estimated measurement time in which the recipe of FIG. 14 is rearranged by the measurement pattern C.

FIG. 18 is a diagram showing a recipe example in which the measurement order in the measurement pattern B is selected.

FIG. 19 is a diagram for explaining calculation of an estimated measurement time of the measurement pattern A in the recipe of FIG. 18.

FIG. 20 is a diagram for explaining calculation of an estimated measurement time in which the recipe of FIG. 18 is rearranged by the measurement pattern B.

FIG. 21 is a diagram for explaining calculation of an estimated measurement time in which the recipe of FIG. 18 is rearranged by the measurement pattern C.

DETAILED DESCRIPTION

One embodiment of the present disclosure will now be described with reference to FIGS. 1 to 21.

Figure 1:
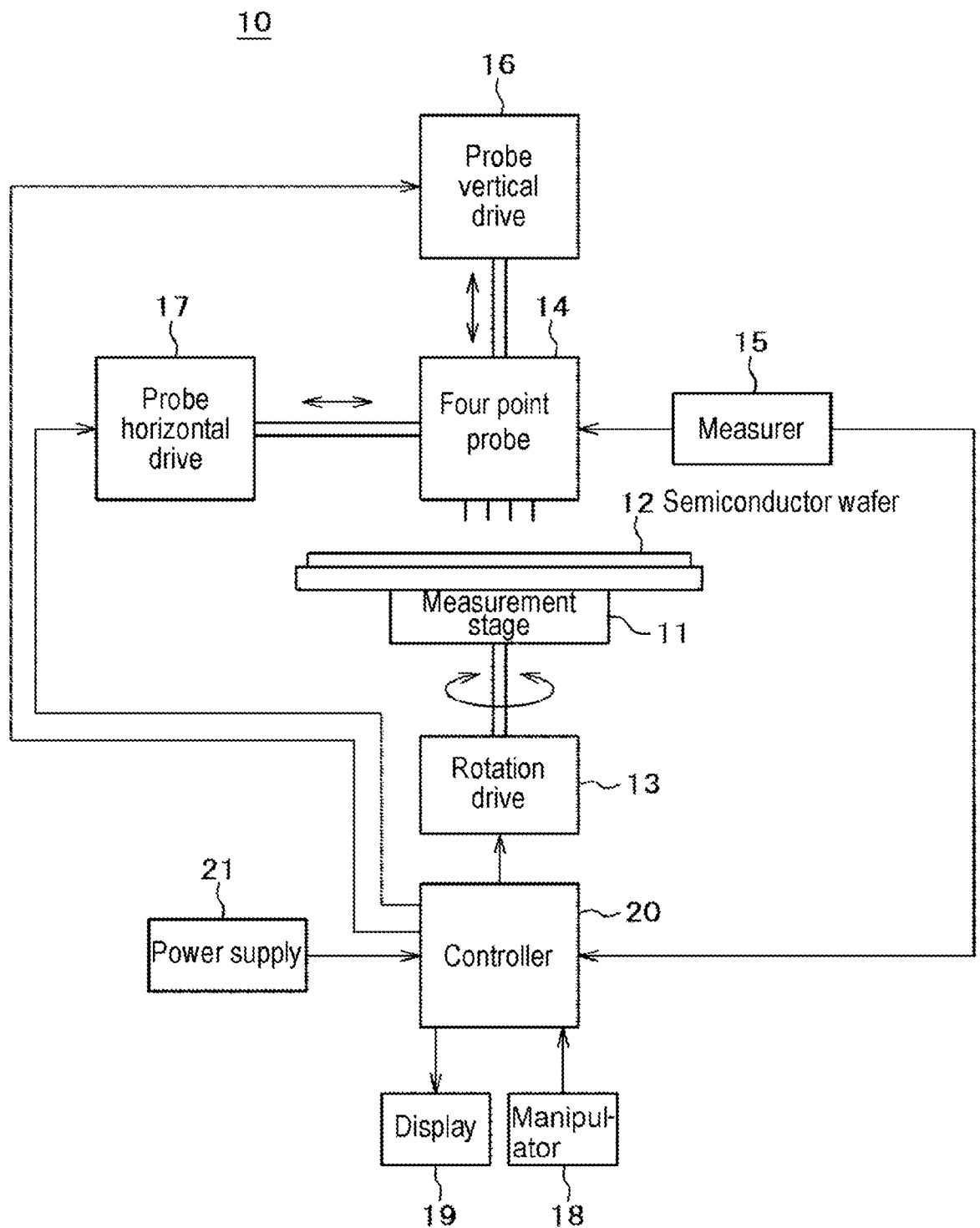
FIG. 1 is a block diagram showing a configuration of a semiconductor wafer resistivity measuring device according to embodiments of the present disclosure.

As shown in FIG. 1, a resistivity measuring device 10 of a semiconductor wafer includes a measurement stage 11, a rotation drive 13, a four point probe 14, a measurer 15, a probe vertical drive 16, a probe horizontal drive 17, and a manipulator 18, a display 19, a controller 20, and a power supply 21.

The measurement stage 11 is a disc-shaped table on which a semiconductor wafer 12 of the measurement target (object to be measured) is placed. The rotation drive 13 is configured to rotate the measurement stage 11 and stop the rotation at a predetermined angle. The four point probe 14 is a probe having four probes that come into contact with the upper surface of the semiconductor wafer 12 placed on the measurement stage 11 to measure the resistivity of the semiconductor wafer 12. The measurer 15 is configured to measure a plurality of measurement items for supplying a measurement current to the semiconductor wafer 12 through the four point probe 14 to obtain the resistivity.

The probe vertical drive 16 is a vertical drive that moves the four point probe 14 in a vertical direction to bring the four point probe 14 into contact with the semiconductor wafer 12. The probe horizontal drive 17 is a horizontal drive that moves the probe vertical drive 16 and the four point probe 14 in a radial direction of the measurement stage 11, that is, in a diameter direction of the semiconductor wafer 12. The operation of both the probe horizontal drive 17 and the rotation drive 13 makes it possible to measure the resistivity of the semiconductor wafer 12 at a desired position.

The manipulator 18 is configured to input a recipe for designating a required measurement point position on the upper surface of the semiconductor wafer 12. The display 19 is configured to display data such as the position of the measurement point and the resistivity of the measurement result. The controller 20 includes a CPU and a storage device (storage) for storing a control program to be executed by the CPU, and is configured as a computer together with a storage that stores at least a recipe and a measurement pattern for measuring the semiconductor wafer 12. The controller 20 controls the operations of the rotation drive 13, the probe horizontal drive 17, and the probe vertical drive 16 according to a recipe commanded from the manipulator 18, so that the four point probe 14 comes into contact with the designated measurement point position on the upper surface of the semiconductor wafer 12. The power supply 21 supplies power for operating each part of the resistivity measuring device 10. Although the manipulator 18 and the display 19 in FIG. 1 are separate parts, it may be configured as a manipulation-display by unifying them into one part. Further, although the storage is provided inside the controller 20, the storage may be provided outside the controller 20.

In FIG. 1, the operation is performed to come the four point probe 14, which is controlled based on the recipe input from the manipulator 18, into contact with the upper surface of the semiconductor wafer 12 placed on the measurement stage 11 and to measure the resistivity of the semiconductor wafer 12 (from the measurer 15).

Figure 2:
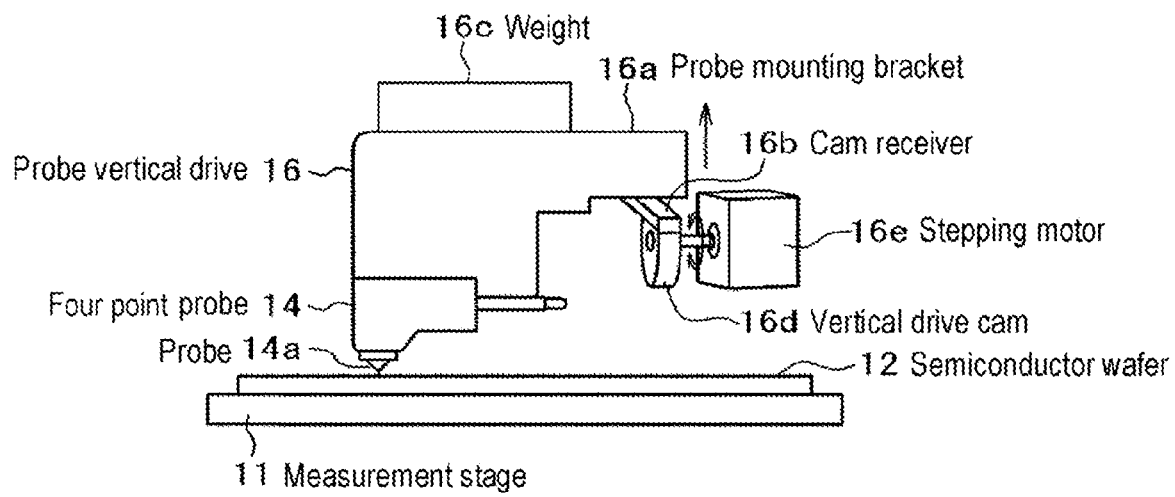
FIG. 2 is an external view showing a configuration of a probe vertical drive, a four point probe, a semiconductor wafer, and a measurement stage according to embodiments of the present disclosure.

Next, the probe vertical drive 16 will be described with reference to FIG. 2. The probe vertical drive 16 is composed of a probe mounting bracket 16a, a cam receiver 16b, a weight 16c, a vertical drive cam 16d, and a stepping motor 16e.

The four point probe 14 is mounted on the probe mounting bracket 16a. The cam receiver 16b receives a probe vertical driving force together with the probe mounting bracket 16a. The weight 16c has a sufficient mass to give a static load in a vertical direction to the probe vertical drive 16. The vertical drive cam 16d is connected to the shaft of the stepping motor 16e and supports the weight of the probe mounting bracket 16a including the weight of the weight 16c on the shaft of the stepping motor 16e by keeping in contact with the leading end portion of the cam receiver 16b. The vertical drive cam 16d has, for example, an eccentric circular cam shape and is capable of moving up and down the cam receiver 16b depending on the rotation angle. Since the cam receiver 16b supported by the probe mounting bracket 16a is axially coupled to the vertical drive cam 16d supported by a support member independent from the probe mounting bracket 16a, the stepping motor 16e is capable of being rotated/stopped at any rotation angle according to the recipe commanded from the controller 20.

With the above configuration, the probe vertical drive 16 is controlled according to the recipe having a load applied to the probe suitable for the type of the semiconductor wafer 12 and a probe vertical movement speed, so that the appropriate contact between the four point probe 14 and the semiconductor wafer 12 can be realized. Then, the resistivity of the semiconductor wafer 12 is measured by the measurer 15.

Figure 3:
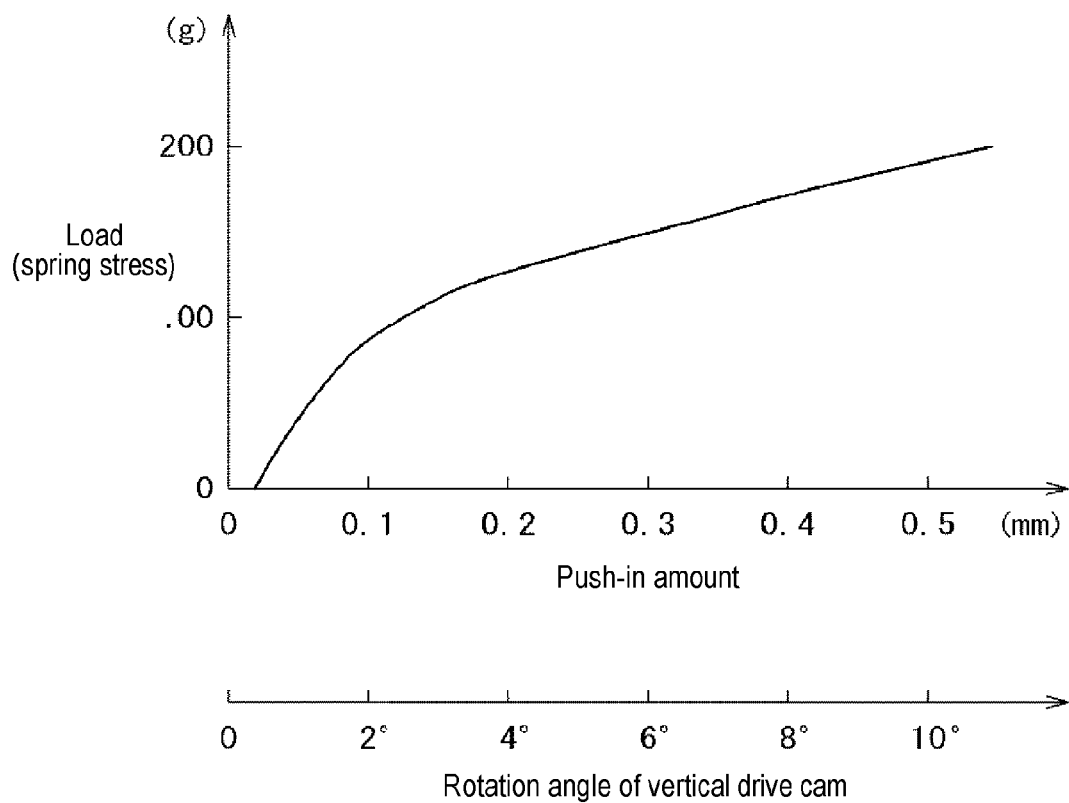
FIG. 3 is a graph showing experimental values indicative of a relationship between a push-in amount of a probe, a rotation angle of a vertical drive cam, and a cam stress.

Here, FIG. 3 shows experimental values showing a relationship between the push-in amount of the probes 14a, the rotation angle of the vertical drive cam 16d, and a spring stress that is a load on the semiconductor wafer 12. Further, in the controller 20, the relationship between the push-in amount, the rotation angle of the vertical drive cam 16d, and the load as shown in the graph of FIG. 3 is stored in the storage device of the controller 20 in advance as the control program. In this way, the controller 20 adjusts the rotation angle of the vertical drive cam 16d stops the four point probe 14 at an arbitrary position (push-in amount) shown in FIG. 3 so that it is possible to set a load applied by the probes 14a to the semiconductor wafer 12. Thus, it is possible to arbitrarily control a contact pressure to be suitable for the surface material of the semiconductor wafer 12.

Next, a method of measuring the resistivity by the resistivity measuring device 10 of the semiconductor wafer 12 will be described.

First, the controller 20 receives the recipe for designating a required measurement point position on the upper surface of the semiconductor wafer 12 and determines a measurement order of a plurality of measurement points based on the recipe.

Next, the controller 20 controls the probe horizontal drive 17 to move the probe vertical drive 16 and the four point probe 14 in the diameter direction of the semiconductor wafer 12, and the rotation drive 13 to rotate the measurement stage 11 on which the semiconductor wafer 12 is placed to move the four point probe 14 to a desired measurement point position on the semiconductor wafer 12.

Next, the controller 20 controls the probe vertical drive 16 to lower the four point probe 14 by an arbitrary push-in amount setting to bring the four probes 14a into contact with the semiconductor wafer 12.

Next, the controller 20 determines a contact reference position (a position where the push-in amount is 0.00 mm). This determination is made by the controller 20 by determining whether a voltage between two of the four probes 14a of the four point probe 14, which is monitored by a voltmeter (in the measurer 15), is within 0 mV±threshold value. The controller 20 sets a timing when the voltage between the two probes becomes 0 mV, as the contact reference position (the position where the push-in amount is 0.00 mm).

When the voltage value between the two probes is within the threshold value, the controller 20 measures the resistivity.

Further, when the voltage value between the two probes are out of the threshold value, the controller 20 raises and again lowers the four point probe 14. The controller 20 stops the resistivity measurement when the voltage value between the two probes are outside of the threshold value even when the four point probe 14 is again lowered a predetermined number of times. In this case, the controller 20 displays an alarm indicative of the stop of the resistivity measurement on the display 19.

A method of determining a position of the four point probe 14 with respect to the measurement point of the semiconductor wafer 12 arranged on the measurement stage 11 will be described with reference to FIGS. 4A and 4B.

Figure 4A:
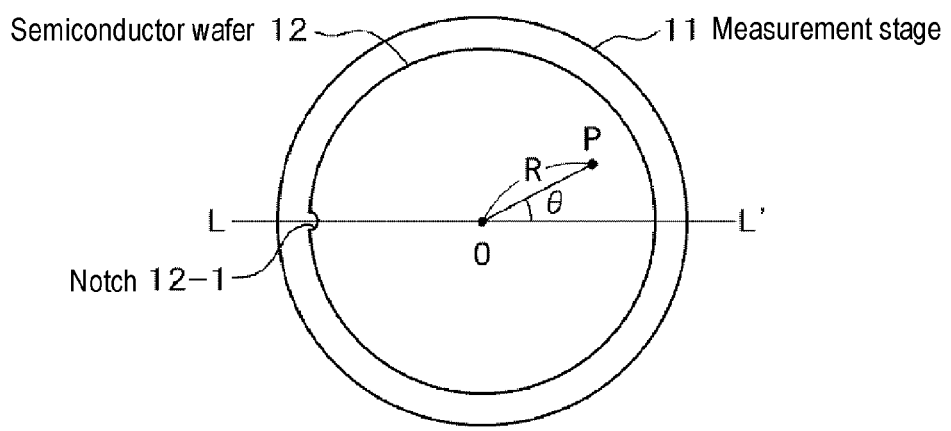
FIG. 4A is a schematic plane view for explaining a state before determining a position of a four point probe with respect to a semiconductor wafer arranged on a measurement stage according to embodiments of the present disclosure.

FIG. 4A shows a state in which the semiconductor wafer 12 is placed on the measurement stage 11 before determining the position. A direction L-L' in which the four point probe 14 is moved by the probe horizontal drive 17 is set as a reference direction. Normally, a notch 12-1 of the semiconductor wafer 12 is placed so as to coincide with the reference direction L-L'. The rotation center of the measurement stage 11 refers to as O, and the position of the desired measurement point refers to as P. A distance between the rotation center O of the measurement stage 11 and the measurement point P refers to as R, and an angle (counterclockwise angle) formed by a line segment OP with the reference direction L-L' refers to as θ.

Figure 4B:
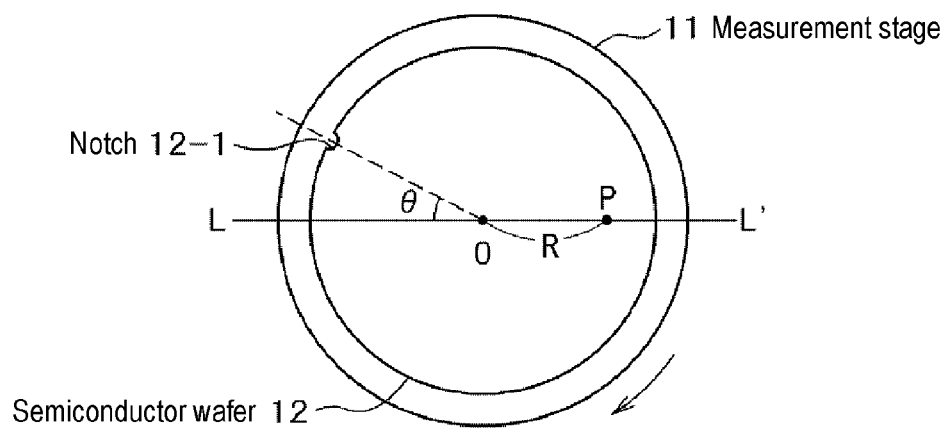
FIG. 4B is schematic plane view for explaining a state after determining the position of the four point probe with respect to the semiconductor wafer arranged on the measurement stage according to embodiments of the present disclosure.

FIG. 4B shows a state after determining the position. The position determination of the measurement point is performed by the following two operations.

(1) The four point probe 14 is moved by the probe horizontal drive 17 to a position spaced apart from the rotation center O of the measurement stage 11 by R in an L' direction.

(2) The measurement stage 11 is rotated clockwise by θ from the reference direction L-L' by the rotation drive 13.

By these two operations, the four point probe 14 moves directly above the desired measurement point P on the semiconductor wafer 12. These two operations are performed in parallel.

Next, the position determination of the four point probe 14 with respect to a plurality of measurement points will be described with reference to FIGS. 5A to 5E.

Figure 5A:
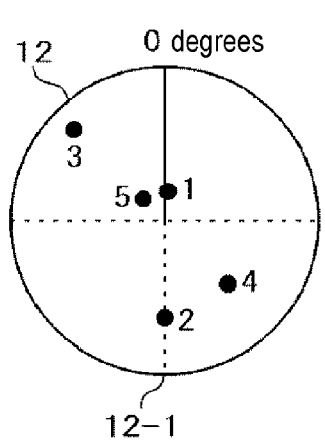
FIG. 5A is a diagram showing a state where a position is determined at a measurement point 1.

In FIG. 5A, the position of the four point probe 14 is determined at the measurement point 1. For example, (R, θ)s of the measurement points 1, the measurement point 2, the measurement point 3, the measurement point 4, and the measurement point 5 on the semiconductor wafer 12 shown in FIG. 5A are set to (10, 0), (100, 180), (140, 45), (100, 225), and (10, 45), respectively. Here, the unit of R is mm, and the unit of θ is degree.

Figure 5B:
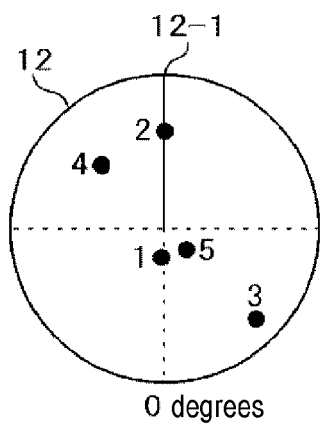
FIG. 5B is a diagram showing a state where a position is determined at a measurement point 2.
Figure 5C:
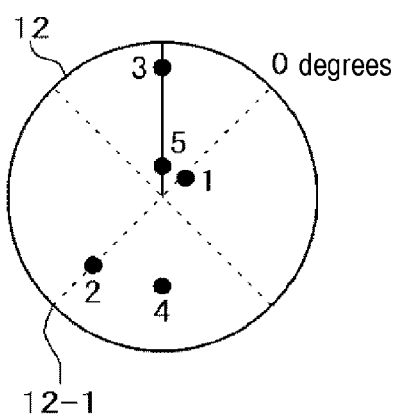
FIG. 5C is a diagram showing a state where a position is determined at a measurement point 3.
Figure 5D:
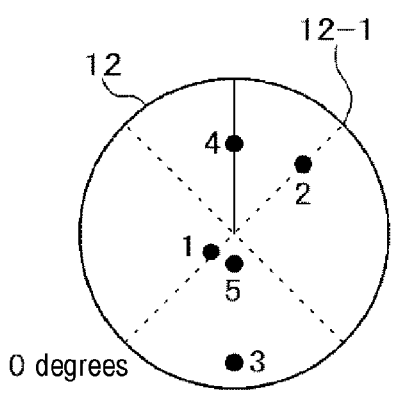
FIG. 5D is a diagram showing a state where a positon is determined at a measurement point 4.
Figure 5E:
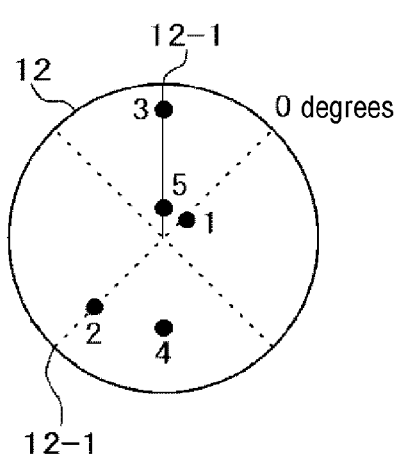
FIG. 5E is a diagram showing a state where a position is determined at a measurement point 5.

When the positioning determination is moved from the measurement point 1 to the measurement point 2 shown in FIG. 5A, as shown in FIG. 5B, the measurement stage 11 rotates 180 degrees clockwise and the four point probe 14 moves outward by 90 mm in a radial direction. When the position determination is moved from the measurement point 2 to the measurement point 3 shown in FIG. 5B, as shown in FIG. 5C, the measurement stage 11 rotates 135 degrees clockwise and the four point probe 14 moves outward by 40 mm in a radial direction. When the position determination is moved from the measurement point 3 to the measurement point 4 shown in FIG. 5C, as shown in FIG. 5D, the measurement stage 11 rotates 180 degrees clockwise and the four point probe 14 moves to a center by 40-mm in a radial direction. When the position determination is moved from the measurement point 4 to the measurement point 5 shown in FIG. 5D, as shown in FIG. 5E, the measurement stage 11 rotates 180 degrees clockwise and the four point probe 14 moves to the center by 90 mm in a radial direction.

Depending on the positional relationship between the plurality of measurement points and the order of movement between the measurement points, the measurement stage 11 and the arm of the probe horizontal drive 17 of the resistivity measuring device 10 may move unnecessarily, which may take time to complete the measurement.

Therefore, the measurement order is considered in order to minimize the unnecessary operation in the movement between the measurement points. The controller 20 calculates an estimated time including a movement time between the measurement points based on the set values of the radius (R) and the angle (θ) of the measurement points included in the recipe in a plurality of measurement orders, and automatically selects a measurement order that can be the fastest. For the measurement order, for example, three types of rules are prepared and the measurement points are rearranged according to the rules.

Example of the measurement order rules (measurement patterns) are as follows.

[Measurement Pattern A]
  This is an order that control information input from the manipulator 18 is set and registered, and rearrangement is not performed (recipe setting order).

[Measurement Pattern B]
  This is an order that the movement of the arm of the probe horizontal drive 17 in which the four point probe 14 is installed is minimized (arm movement amount minimum order).

[Measurement Pattern C]
  This is an order that the rotation of the measurement stage 11 on which the semiconductor wafer 12 is placed is minimized (stage rotation amount minimum order).

The measurement order is not limited to the above three types of rules, and may be two or more types of rules. For example, the controller 20 calculates the estimated time required for measurement when measured according to the measurement pattern A, rearranges the setting order of each measurement point set in the control information according to the measurement pattern B or the measurement pattern C, and calculates the estimated time when measured according to the rearranged setting order. The controller 20 selects the setting order in which the estimated time is the fastest (shortest) among the estimated times calculated respectively, and measures in the selected setting order.

Figures 6A, 6B:
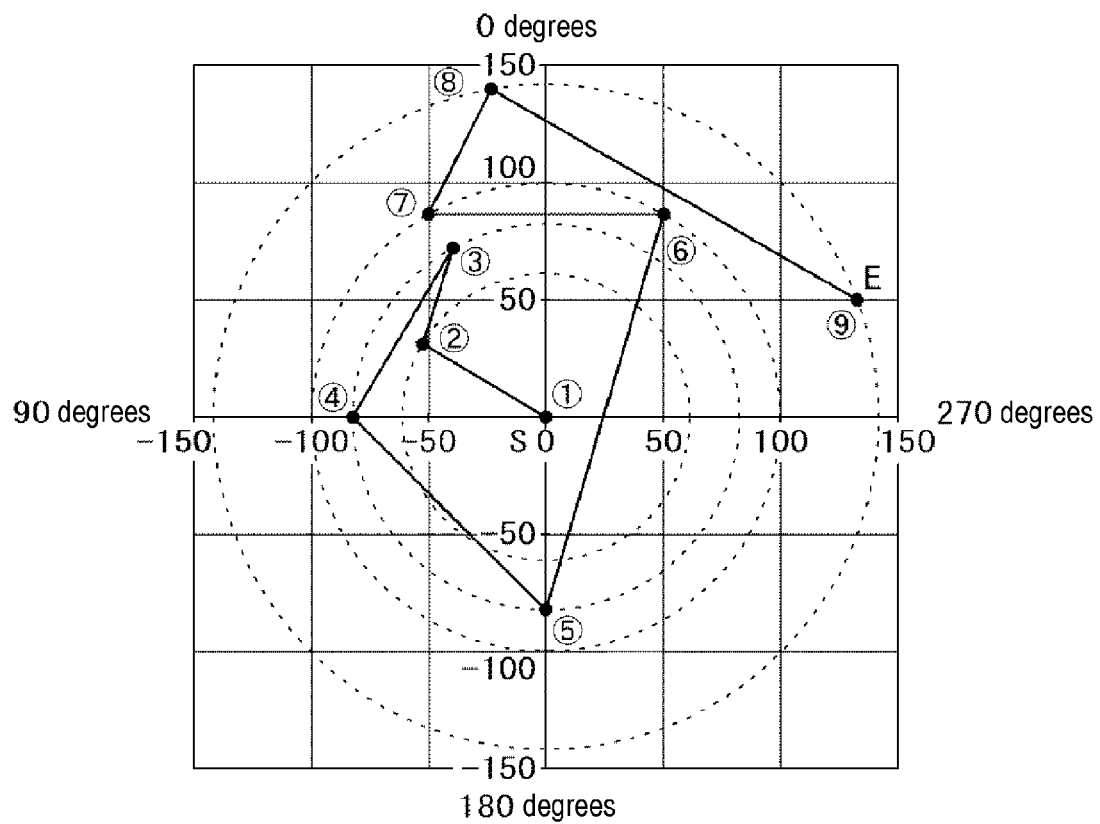
FIG. 6A is a diagram showing a recipe.
FIG. 6B is a diagram for explaining a measurement pattern A in which a measurement order is a recipe setting order.

First, the measurement pattern A will be described with reference to FIGS. 6A and 6B. When the recipe is set as shown in FIG. 6A, the normal measurement order according to the recipe setting order is as shown in FIG. 6B. Nine small black circles shown in FIG. 6B are measurement points, and circled numbers (numbers enclosed by circles) indicate measurement point numbers. Here, the measurement points 1 to 9 correspond to the circled numbers 1 to 9. The setting order is the ascending order of the numbers at the measurement points. The measurement point 1 is located at the center of the semiconductor wafer 12 which is the rotation center O of the measurement stage 11, and the setting order is 1. When the recipe is set in the setting order as shown in FIG. 6A, the measurement order is determined in the ascending order of the numbers in the setting order, that is, in the ascending order of the circled numbers shown in FIG. 6B.

Figure 7:
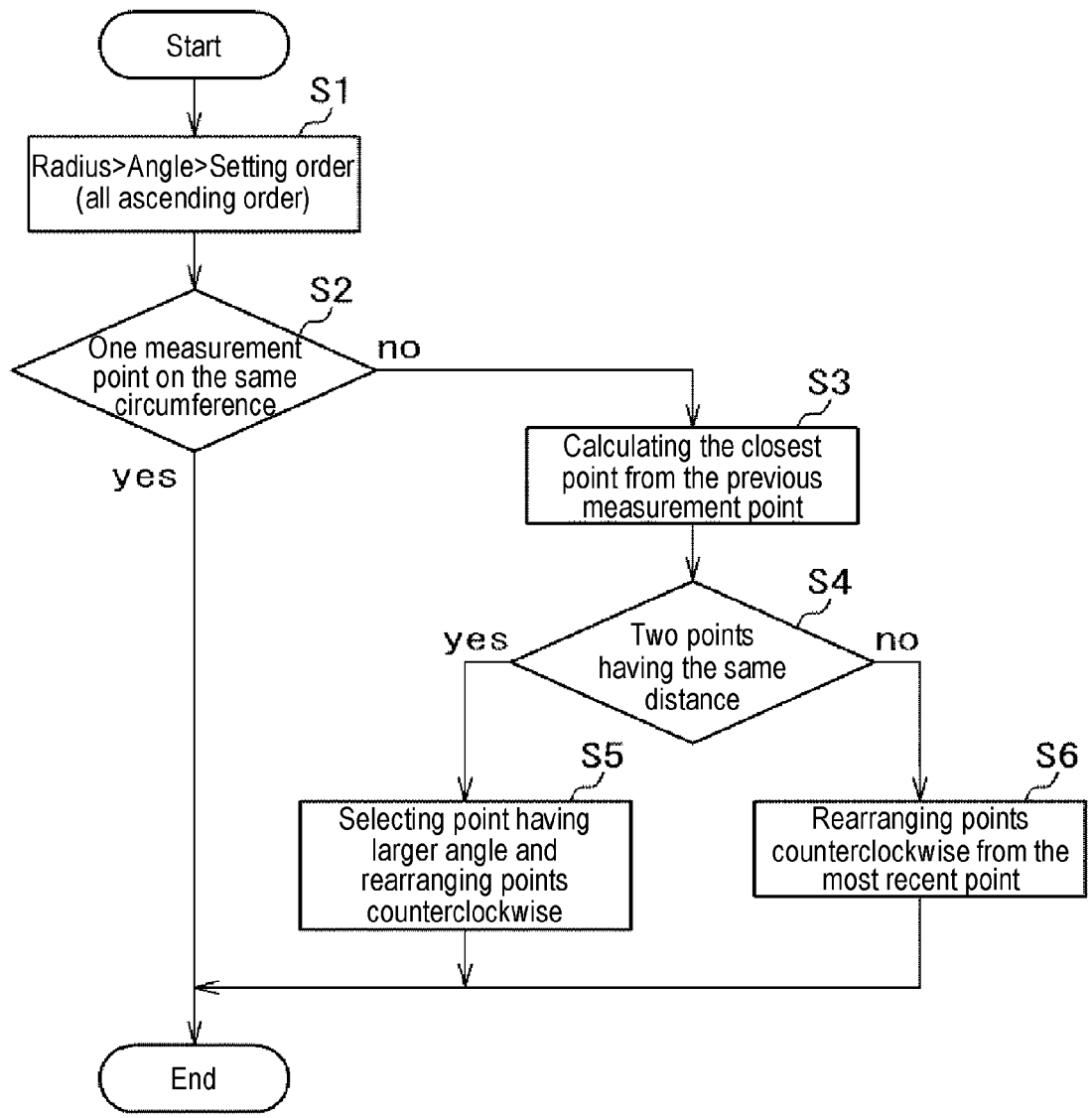
FIG. 7 is a flowchart for explaining a method of selecting a measurement order in a measurement pattern B.

Next, the measurement pattern B will be described with reference to FIGS. 7, 8A, and 8B. As shown in FIG. 7, a method of selecting the measurement order of the pattern B is as follows.
(Step S1)
The controller 20 rearranges the setting order registered in the recipe in the ascending order in terms of radius, angle, and setting order. Here, the priority of rearrangement is radius>angle>setting order.
(Step S2)
The controller 20 determines whether or not there is one measurement point on the same circumference at the measurement point having the minimum radius. When there is one measurement point on the same circumference (in the case of "yes"), the process ends and proceeds to the determination of the measurement point having the second smallest radius (step S2).
(Step S3)
When a plurality of measurement points exist on the same circumference (in the case of "no"), the controller 20 calculates the closest point from the previous measurement point, selects it as the next measurement point, and determines the route counterclockwise.
(Step S4)
The controller 20 determines whether or not there are two closest points (two points having the same distance).
(Step S5)
When there are two closest points (in the case of "yes"), the controller 20 selects the first measurement point counterclockwise from the previous measurement point and rearranges the measurement points counterclockwise from there. Next, the process proceeds to the determination of the measurement point having a small radius (step S2).
(Step S6)
When there is only one closest point (in the case of "no"), the controller 20 rearranges the measurement points counterclockwise from the most recent point. Next, the process proceeds to the determination of the measurement point having a small radius (step S2).

The controller 20 repeats steps S2 and subsequent steps in the ascending order of radius to determine the measurement order.

Figures 8A, 8B:
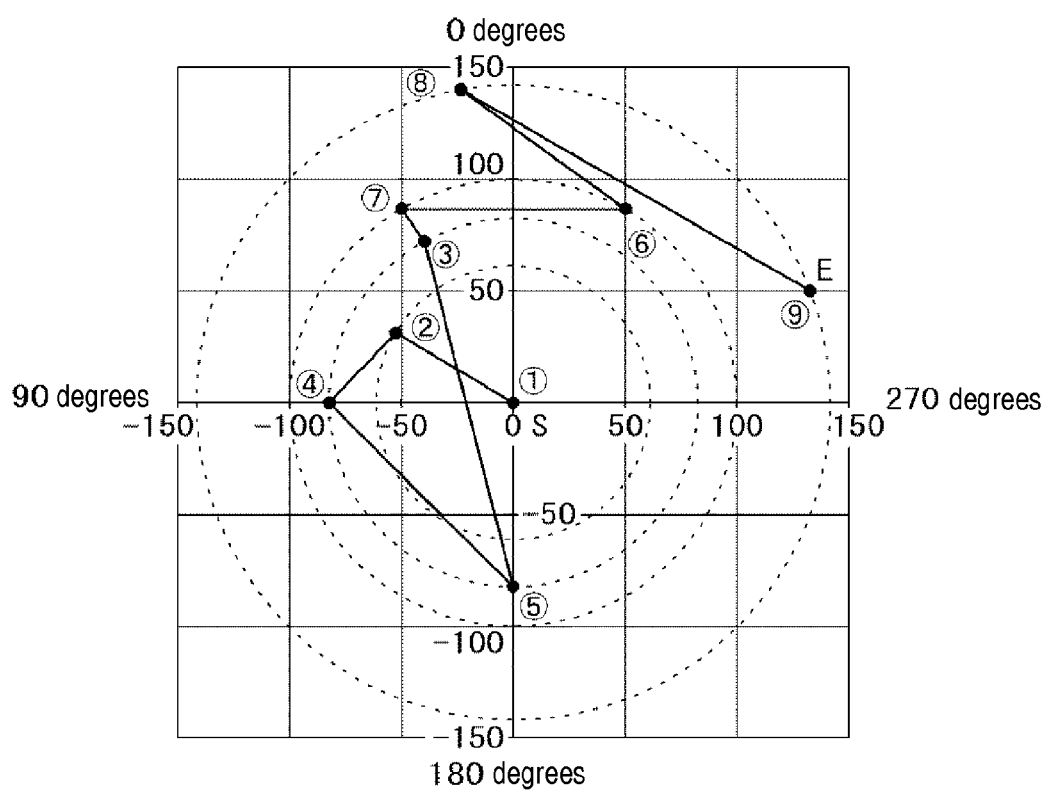
FIG. 8A is a diagram showing a state in which the recipe of FIG. 6A is rearranged according to the measurement pattern B.
FIG. 8B is a diagram indicating FIG. 8A on a wafer.

The measurement order determined by the method of selecting the measurement order of the measurement pattern B for the recipe set as shown in FIG. 6A is as shown in FIGS. 8A and 8B. Hereinafter, the measurement order of the measurement pattern B will be described in detail.

Since only the first set measurement point 1 is located on the same circumference having the minimum radius (R=0), the measurement order of the measurement point 1 (setting order 1) becomes "1," and the measurement point 1 becomes a measurement start position S.

Since only the second set measurement point 2 is located on the same circumference having the second smallest radius (R=60), the measurement order of the measurement point 2 (setting order 2) becomes "2."

The third, fourth, and fifth set measurement points 3, 4, and 5 are located on the same circumference having the third smallest radius (R=80). Since the measurement points 3 and 4 are at the same distance from the previous measurement point 2, the first measurement point 4 is first selected counterclockwise from the measurement point 2 in step S5, and the measurement point 5 and the measurement point 3 are selected counterclockwise. Therefore, the measurement order of the measurement point 4 (setting order 4) becomes "3," the measurement order of the measurement point 5 (setting order 5) becomes "4," and the measurement order of the measurement point 3 (setting order 3) becomes "5."

The sixth and seventh set measurement points 6 and 7 are located on the same circumference having the fourth smallest radius (R=100). Since the measurement point 7 is at the closest distance from the previous measurement point 3, the measurement point 7 is first selected in step S3, and the measurement point 6 is selected counterclockwise. Therefore, the measurement order of the measurement point 7 (setting order 7) become "6," and the measurement order of the measurement point 6 (setting order 6) becomes "7."

The eighth and ninth set measurement points 8 and 9 are located on the same circumference having the fifth smallest radius (R=140). Since the measurement points 8 and 9 are at the same distance from the previous measurement point 6, the first measurement point 8 is first selected counterclockwise from the measurement point 6 in step S5, and the measurement point 9 is selected counterclockwise. Therefore, the measurement order of the measurement point 8 (setting order 8) becomes "8," the measurement order of the measurement point 9 (setting order 9) becomes "9," and thus the measurement point 9 becomes a measurement end position E.

Figure 9:
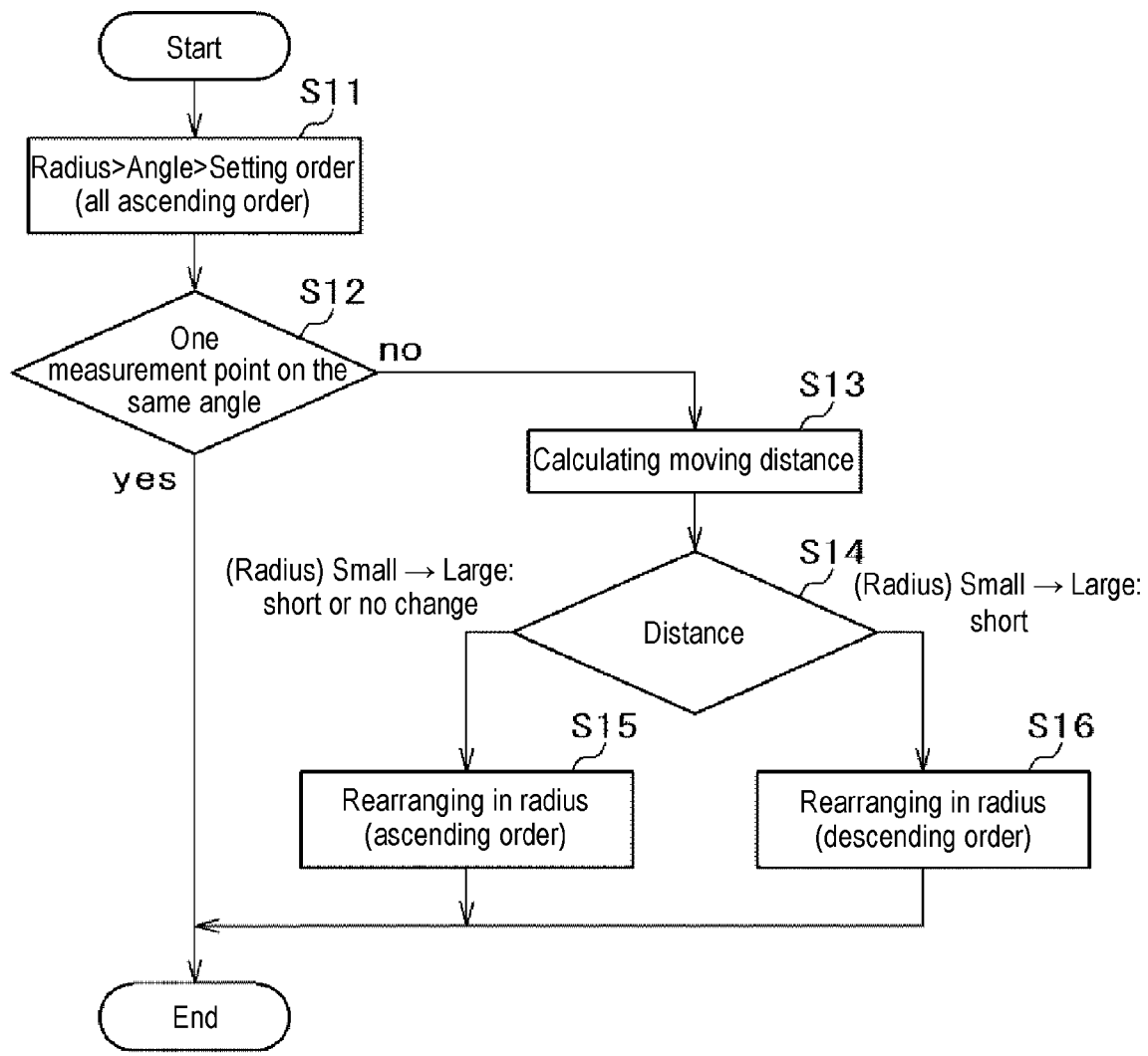
FIG. 9 is a flowchart for explaining a method of selecting the measurement order in a measurement pattern C.

Next, the measurement pattern C will be described with reference to FIG. 9, FIG. 10A and FIG. 10B. As shown in FIG. 9, a method of selecting the measurement order of the pattern C is as follows.
(Step S11)
The controller 20 rearranges the setting order registered in the recipe in the ascending order of angle>radius>setting order. Here, the priority of rearrangement is angle>radius>setting order.
(Step S12)
The controller 20 determines whether or not there is one measurement point on the same angle at the measurement point having the minimum angle. When there is one measurement point on the same angle (in the case of "yes"), the process ends and then proceeds to the determination of the measurement point having the smaller angle (step S12).
(Step S13)
When a plurality of measurement points exist on the same angle (in the case of "no"), the controller 20 calculates a moving distance of the arm of the probe horizontal drive 17 with respect to the previous measurement point.
(Step S14)

The controller 20 determines a route having a short moving distance (which is shorter, a route moving from the smaller radius to the larger radius or a route moving from the larger radius to the smaller radius).
(Step S15)

When the moving distance is shortened in case of moving from the smaller radius to the larger radius, the controller 20 rearranges the measurement points in the ascending order of radius. The measurement points are rearranged in the ascending order of radius even when all routes have the same moving distance (when there are the measurement point having the smaller radius and the measurement point having the larger radius than the previous measurement point). Next, the process proceeds to the determination of the measurement point having the smaller angle (step S12).
(Step S16)

When the moving distance is shortened in case of moving from the larger radius to the smaller radius, the controller 20 rearranges the measurement points in the descending order of radius. Next, the process proceeds to the determination of the measurement point having the smaller radius (step S12).

The controller 20 repeats steps S12 and subsequent steps in the ascending order of angle to determine the measurement order.

Figures 10A, 10B:
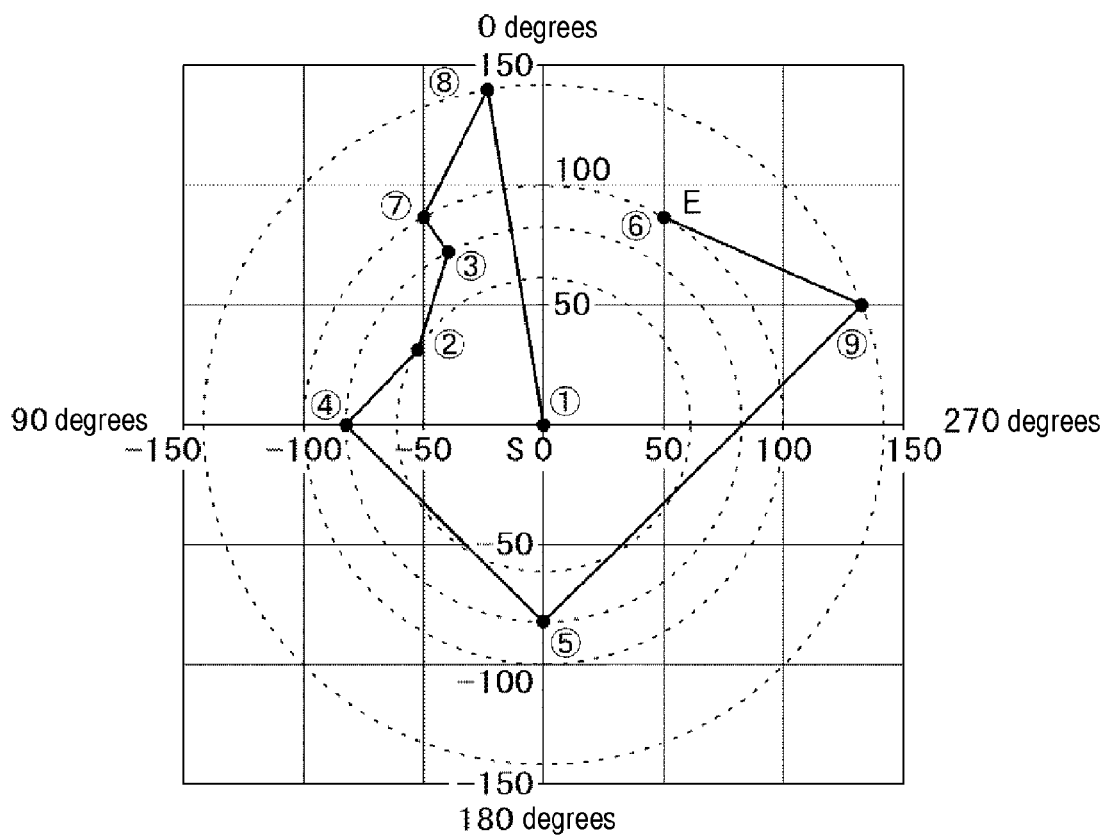
FIG. 10A is a diagram showing a state in which the recipe of FIG. 6A is rearranged according to the measurement pattern C.
FIG. 10B is a diagram showing FIG. 10A on a wafer.

The measurement order determined by the method of selecting the measurement order of the pattern C for the recipe set as shown in FIG. 6A is as shown in FIGS. 10A and 10B. Hereinafter, the measurement order of the pattern C will be described in detail.

Since only the first set measurement point 1 is located on the same radius having the minimum angle (θ=0), the measurement order of the measurement point 1 (setting order 1) becomes "1," and the measurement point 1 becomes a measurement start position S.

Since only the eighth set measurement point 8 is located on the same radius having the next smaller angle (θ=10), the measurement order of the measurement point 8 (setting order 8) becomes "2."

The third and seventh set measurement points 3 and 7 are located on the same radius having the next smaller angle (θ=30). Since the measurement point 7 has a short moving distance from the previous measurement point 8, the measurement point 7 having the larger radius is first selected in step S15, and the measurement point 3 is then selected. Therefore, the measurement order of the measurement point 7 (setting order 7) becomes "3," and the measurement order of measurement point 3 (setting order 3) becomes "4."

Since only the second set measurement point 2 is located on the same radius having the next smaller angle (θ=60), the measurement order of the measurement point 2 (setting order 2) becomes "5."

Since only the fourth set measurement point 4 is located on the same radius having the next smaller angle (θ=90), the measurement order of the measurement point 4 (setting order 4) becomes "6."

Since only the fifth set measurement point 5 is located on the same radius having the next smaller angle (θ=180), the measurement order of the measurement point 5 (setting order 5) becomes "7."

Since only the ninth set measurement point 9 is located on the same radius having the next smaller angle (θ=290), the measurement order of the measurement point 9 (setting order 9) becomes "8."

Since only the sixth set measurement point 6 is located on the same radius having the next smaller angle (θ=330), the measurement order of the measurement point 6 (setting order 6) becomes "9," and the measurement point 6 becomes a measurement end position E.
(Measurement Time Investigation)

Figure 11:
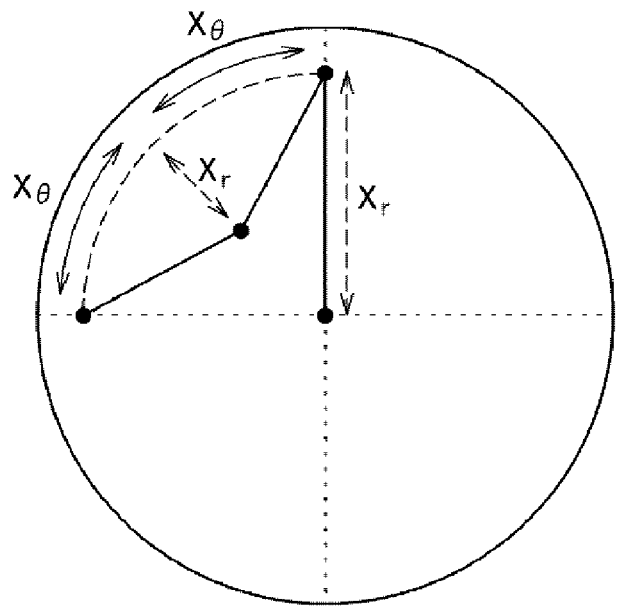
FIG. 11 is a diagram for explaining an arm movement amount and a stage movement amount.

The measurement time for the movement amount of each of the arm of the probe horizontal drive 17 in which the four point probe 14 is installed, and the measurement stage 11, was investigated. Here, the movement amount refers to an amount (mm or degree) when each of the arm of the probe horizontal drive 17 and the measurement stage 11 moves from the current measurement point to the next measurement point, and the measurement time refers to a time (seconds (s)) until each of the arm of the probe horizontal drive 17 and the measurement stage 11 moves to the next measurement point and the measurement is finished. In FIG. 11, a straight dashed line arrow indicates the movement amount of the arm of the probe horizontal drive 17 (arm movement amount: $x_r$), and a circular arc-shaped solid line arrow indicates the movement amount of the measurement stage 11 (stage movement amount (stage rotation amount): $x_\theta$).

Figure 12A:
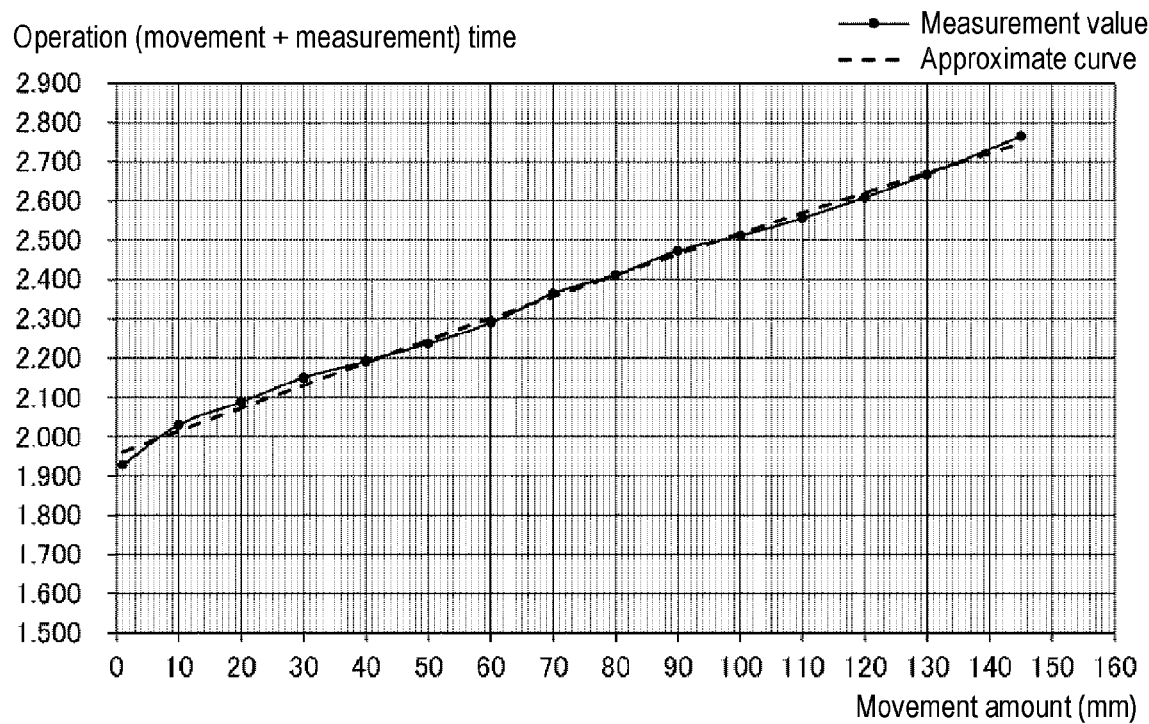
FIG. 12A is a diagram showing measured values and their approximate curve with respect to the relationship between the arm movement amount and the measurement time.

FIG. 12A shows a graph of measured values and an approximate curve obtained with respect to the relationship between the arm movement amount and the measurement time, and FIG. 12B shows a graph of measured values and an approximate curve obtained with respect to the relationship between the stage movement amount and the measurement time.

The following equation (1) is calculated from the approximate curve of FIG. 12A, and the following equation (2) is calculated from the approximate curve of FIG. 12B. When an arm movement amount, which is the radial movement amount, refers to as $x_r$, a stage movement amount, which is the angular movement amount, refers to as $x_\theta$ a time accompanied with the movement of a radial direction $y_r$, be, and a time accompanied with the movement of an angular direction refers to as $y_\theta$, the equations become as follows.

$$y_r = -4(10^{-6})x_r^2 + 0.006x_r + 1.9564 \,(0 \le x_r < 150) \quad (1)$$

$$y_\theta = -2(10^{-5})x_\theta^2 + 0.0081x_\theta + 2.0083 \,(0 \le x_\theta < 180) \quad (2)$$

When $x_r=0$ and $x_\theta=0$ (no movement, respectively), $y_r=1.9564$ and $y_\theta=2.0083$. It can be determined that the constant part of the equations (1) and (2) is the time of probe down, measurement, and probe up.

Since $y_r=1.9564$ (s) and $y_\theta=2.0083$ (s) are constant for each movement amount, they are omitted, and the following equations (3) and (4) are used for calculating the estimated measurement time. That is, when the arm movement time, which is the radial movement time, refers to as yr and the stage movement time, which is the angular movement time, refers to as ye, the equations becomes as follows.

$$y_r = -4(10^{-6})x_r^2 + 0.006x_r \,(0 \le x_r < 150) \quad (3)$$

$$y_\theta = -2(10^{-5})x_\theta^2 + 0.0081x_\theta \,(0 \le x_\theta < 180) \quad (4)$$

Next, an example of calculating the scheduled measurement time of the measurement patterns A, B, and C will be described using the recipe information of FIG. 13A as an example.

In the case of the measurement pattern A, when the setting order is the measurement order, the movement amounts (radius, angle) in the measurement order 1→2, 2→3, 3→4, and 4→5, refer to as (r1, θ1), (r2, θ2), (r3, θ3), and (r4, θ4), respectively, and the estimated measurement times (radius, angle), refer to as $(y_{r1}, y_{\theta1})$, $(y_{r2}, y_{\theta2})$, $(y_{r3}, y_{\theta3})$, and $(y_{r4}, y_{\theta4})$, respectively, the movement amounts becomes as follows.

$$(r1, \theta1) = (90, 180)$$

$$(r2, \theta2) = (40, 135)$$

$$(r3, \theta3) = (40, 180)$$

$$(r4, \theta4) = (90, 180)$$

When calculating the estimated measurement time by substituting this information into the above equations (3) and (4), the equations are as follows.

$$y_{r1} = -4 \times 10^{-6} \times 90^2 + 0.006 \times 90 = 0.5076$$

$$y_{\theta1} = -2 \times 10^{-5} \times 480^2 + 0.0081 \times 180 = 0.81$$

$$y_{r2} = -4 \times 10^{-6} \times 40^2 + 0.006 \times 40 = 0.2336$$

$$y_{\theta2} = -2 \times 10^{-5} \times 135^2 + 0.0081 \times 135 = 0.729$$

$$y_{r3} = -4 \times 10^{-6} \times 40^2 + 0.006 \times 40 = 0.2336$$

$$y_{\theta3} = -2 \times 10^{-5} \times 180^2 + 0.0081 \times 180 = 0.81$$

$$y_{r4} = -4 \times 10^{-6} \times 90^2 + 0.006 \times 90 = 0.5076$$

$$y_{\theta4} = -2 \times 10^{-5} \times 180^2 + 0.0081 \times 480 = 0.81$$

Since the arm of the probe horizontal drive 17 and the measurement stage 11 operate simultaneously up to the next measurement point, the maximum value in $y_r$ and $y_\theta$ is regarded as the measurement time. Therefore, when the total estimated measurement time refers to as $T_{totalA}$, $T_{totalA}$ becomes as follows.

$$T_{totalA} = y_{\theta1} + y_{\theta2} + y_{\theta3} + y_{\theta4} = 3.159 \text{ (s)}$$

In the case of the measurement pattern B, the measurement order is as shown in FIG. 13B. The movement amounts become as follows.

$$(r1, \theta1) = (0, 45)$$

$$(r2, \theta2) = (90, 135)$$

$$(r3, \theta3) = (0, 45)$$

$$(r4, \theta4) = (40, 180)$$

When calculating the estimated measurement time by substituting this information into the above equations (3) and (4), the equations become as follows.

$$y_{r1} = -4 \times 10^{-6} \times 0^2 + 0.006 \times 0 = 0$$

$$y_{\theta1} = -2 \times 10^{-5} \times 45^2 + 0.0081 \times 45 = 0.324$$

$$y_{r2} = -4 \times 10^{-6} \times 90^2 + 0.006 \times 90 = 0.5076$$

$$y_{\theta2} = -2 \times 10^{-5} \times 135^2 + 0.0081 \times 135 = 0.729$$

$$y_{43} = -4 \times 10^{-6} \times 0^2 + 0.006 \times 0 = 0$$

$$y_{\theta3} = -2 \times 10^{-5} \times 45^2 + 0.0081 \times 45 = 0.324$$

$$y_{r4} = -4 \times 10^{-6} \times 40^2 + 0.006 \times 40 = 0.2336$$

$$y_{\theta4} = -2 \times 10^{-5} \times 180^2 + 0.0081 \times 480 = 0.81$$

When the total estimated measurement time refers to as $T_{totalB}$, $T_{totalB}$ becomes as follows.

$$T_{totalB} = y_{\theta1} + y_{\theta2} + y_{\theta3} + y_{\theta4} = 2.187 \text{ (s)}$$

In the case of the measurement pattern C, the measurement order is as shown in FIG. 13C. The movement amounts becomes as follows.

$$(r1, \theta1) = (0, 45)$$

$$(r2, \theta2) = (130, 0)$$

$$(r3, \theta3) = (40, 135)$$

$$(r4, \theta4) = (0, 45)$$

When calculating the estimated measurement time by substituting this information into the above equations (3) and (4), the equations become as follows.

$$y_{r1} = -4 \times 10^{-6} \times 0^2 + 0.006 \times 0 = 0$$

$$y_{\theta1} = -2 \times 10^{-5} \times 45^2 + 0.0081 \times 45 = 0.324$$

$$y_{r2} = -4 \times 10^{-6} \times 130^2 + 0.006 \times 130 = 0.77948$$

$$y_{\theta2} = -2 \times 10^{-5} \times 0^2 + 0.0081 \times 0 = 0$$

$$y_{r3} = 31 \ 4 \times 10^{-6} \times 40^2 + 0.006 \times 40 = 0.2336$$

$$y_{\theta3} = -2 \times 10^{-5} \times 135^2 + 0.0081 \times 135 = 0.729$$

$$y_{r4} = -4 \times 10^{-6} \times 0^2 + 0.006 \times 0 = 0$$

$$y_{\theta4} = -2 \times 10^{-5} \times 45^2 + 0.0081 \times 45 = 0.324$$

When the total estimated measurement time refers to as $T_{totalC}$, $T_{totalC}$ becomes as follows.

$$T_{totalC} = y_{\theta1} + y_{r2} + y_{\theta3} + y_{\theta4} = 2.15648 \text{ (s)}$$

In $T_{totalA}$, $T_{totalB}$, and $T_{totalC}$, since the minimum is $T_{totalC}$, the measurement order of the pattern C is selected. However, if the estimated measurement times have the same value, they are selected in the order of priority of measurement pattern A>measurement pattern B>measurement pattern C.

In the recipe setting example shown in FIG. 13A, the measurement order of the measurement pattern C is selected, but examples in which the measurement orders of other measurement patterns is selected will be described below.

First, a recipe in which the measurement order of the measurement pattern A is selected will be described with reference to FIGS. 14 to 17.

When a recipe shown in FIG. 14 is set, in the measurement pattern A, the movement amount (radius), which is the arm movement amount (xr), the movement amount (angle), which is the stage movement amount (xθ), the time (radius), which is the arm movement time (yr), and the time (angle), which is the stage movement time (yθ), are calculated as shown in FIG. 15. The larger of the time (radius) and the time (angle) is calculated as the time (s). The total estimated measurement time ($T_{totalA}$) is calculated by summing the times from the setting order 2 to the setting order 17 shown in FIG. 15 and becomes as follows.

$$T_{totalA} = 4.626223 \text{ (s)}$$

When the recipe shown in FIG. 14 is set, in the measurement pattern B, the measurement order is set as shown in FIG. 16, and the movement amount (radius), which is the arm movement amount (xr), the movement amount (angle), which is the stage movement amount (xθ), the time (radius), which is the arm movement time (yr), and the time (angle), which is the stage movement time (yθ), are calculated as shown in FIG. 16. The larger of the time (radius) and the time (angle) is calculated as the time(s). The total estimated measurement time ($T_{totalB}$) is calculated by summing the times from the measurement order 2 to the measurement order 17 shown in FIG. 16 and becomes as follows.

$$T_{totalB}=5.264549 \text{ (s)}$$

When the recipe shown in FIG. 14 is set, in the measurement pattern C, the measurement order is set as shown in FIG. 17, and the movement amount (radius), which is the arm movement amount (xr), the movement amount (angle), which is the stage movement amount (xθ), the time (radius), which is the arm movement time (yr), and the time (angle), which is the stage movement time (yθ), are calculated as shown in FIG. 17. The larger of the time (radius) and the time (angle) is calculated as the time (s). The total estimated measurement time ($T_{totalC}$) is calculated by summing the times from the measurement order 2 to the measurement order 17 shown in FIG. 17 and becomes as follows.

$$T_{totalC}=5.620364 \text{ (s)}$$

Therefore, when the recipe shown in FIG. 14 is set, since $T_{totalA}<T_{totalB}<T_{totalC}$ and $T_{totalA}$ is the minimum, the measurement order of the measurement pattern A is selected.

Next, a recipe in which the measurement order of the measurement pattern B is selected will be described with reference to FIGS. 18 to 21.

When the recipe shown in FIG. 18 is set, in the measurement pattern A, the movement amount (radius), which is the arm movement amount (xr), the movement amount (angle), which is the stage movement amount (xθ), the time (radius), which is the arm movement time (yr), and the time (angle), which is the stage movement time (yθ), are calculated as shown in FIG. 19. The larger of the time (radius) and the time (angle) is calculated as the time(s). The total estimated measurement time ($T_{totalA}$) is calculated by summing the times from the setting order 2 to the setting order 17 shown in FIG. 15, and becomes as follows.

$$T_{totalA}=4.088 \text{ (s)}$$

When the recipe shown in FIG. 18 is set, in the measurement pattern B, the measurement order is set as shown in FIG. 20, and the movement amount (radius), which is the arm movement amount (xr), the movement amount (angle), which is the stage movement amount (xθ), the time (radius), which is the arm movement time (yr), and the time (angle), which is the stage movement time (yθ), are calculated as shown in FIG. 20. The larger of the time (radius) and the time (angle) is calculated as the time(s). The total estimated measurement time ($T_{totalB}$) is calculated by summing the times from the measurement order 2 to the measurement order 17 shown in FIG. 20, and becomes as follows.

$$T_{totalB}=3.7006 \text{ (s)}$$

When the recipe shown in FIG. 18 is set, in the measurement pattern C, the measurement order is set as shown in FIG. 21, and the movement amount (radius), which is the arm movement amount (xr), the movement amount (angle), which is the stage movement amount (xθ), the time (radius), which is the arm movement time (yr), and the time (angle), which is the stage movement time (yθ), are calculated as shown in FIG. 21. The larger of the time (radius) and the time (angle) is calculated as the time (s). The total estimated measurement time ($T_{totalC}$) is calculated by summing the times from the measurement order 2 to the measurement order 17 shown in FIG. 21, and becomes as follows.

$$T_{totalC}=4.0248 \text{ (s)}$$

Therefore, when the recipe shown in FIG. 18 is set, since $T_{totalB}<T_{totalC}<T_{totalA}$ and $T_{totalB}$ is the minimum, the measurement order of the measurement pattern B is selected.

According to the present embodiments, the operation calculates the estimated time when measuring the measurement points according to the setting order of each measurement point set in the recipe, changes the setting order of each measurement point set in the recipe according to the measurement pattern, calculates the estimated times when measuring the measurement points according to the changed setting order, selects the setting order in which the estimated time is the fastest (shortest) among the calculated estimated times, and measures the object to be measured in the selected setting order.

By the above operations, it is possible to increase the number of measurable semiconductor wafers per hour by shortening the measurement time per semiconductor wafer.

By measuring the resistivity of a silicon wafer, the resistivity of an epitaxial wafer formed on the wafer surface, a sheet resistance of a diffusion layer or an implantation layer when impurities are diffused or implanted from the surface, the sheet resistance of a metal film generated on the surface and the like with the semiconductor wafer resistivity measuring device of the present embodiments, feeding-back the measurement results to the process conditions of each semiconductor manufacturing apparatus, that is, setting the process conditions in the semiconductor manufacturing apparatus based on the measurement results, and processing the semiconductor wafer by the semiconductor manufacturing apparatus according to the process conditions, it is possible to improve the uniformity of the quality of the semiconductor device.

According to the present disclosure, it is possible to shorten the measurement time of the resistivity of a semiconductor wafer.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of measuring a resistivity, comprising:
   (a) receiving a recipe for measuring an object to be measured;
   (b) calculating an estimated time when measuring the object according to a setting order of respective measurement points set in the recipe;
   (c) changing the setting order of the respective measurement points set in the recipe according to a measurement pattern for measuring the object and calculating an estimated time when measuring the object according to the changed setting order;
   (d) selecting the setting order in which the estimated time is the shortest among the estimated times calculated in (b) and (c); and
   (e) measuring the object in the selected setting order,
   wherein in (c), the setting order registered in the recipe is rearranged in an ascending order of a radius, an angle, and a setting order.

2. A method of manufacturing a semiconductor device comprising the method of claim 1, further comprising applying a predetermined process on the object based on a result of measuring the resistivity.

3. A non-transitory computer-readable recording medium storing a resistivity measuring program that causes a computer to perform a process comprising:
(a) receiving a recipe for measuring an object to be measured;
(b) calculating an estimated time when measuring the object according to a setting order of respective measurement points set in the recipe;
(c) changing the setting order of the respective measurement points set in the recipe according to a measurement pattern for measuring the object and calculating an estimated time when measuring the object according to the changed setting order;
(d) selecting the setting order in which the estimated time is the shortest among the estimated times calculated in (b) and (c); and
(e) measuring the object in the selected setting order,
wherein in (c), the setting order registered in the recipe is rearranged in an ascending order of a radius, an angle, and a setting order.

4. A resistivity measuring device comprising:
a storage configured to store at least a recipe for measuring an object to be measured and a measurement pattern for measuring the object; and
a controller configured to control to measure the object, wherein the controller is configured to be capable of:
calculating an estimated time when measuring the object according to a setting order of the respective measurement points set in the recipe;
changing the setting order of the respective measurement points set in the recipe according to the measurement pattern;
calculating an estimated time when measuring the object according to the changed setting order;
selecting the setting order in which the estimated time is the shortest among the calculated estimated times; and
measuring the object in the selected setting order, and
wherein the controller is further configured to be capable of rearranging the setting order registered in the recipe in an ascending order of a radius, an angle, and a setting order.

5. The resistivity measuring device of claim 4, comprising:
a table on which the object is placed;
a probe configured to bring a plurality of probes into contact with the object;
a horizontal drive configured to move the probe in a horizontal direction; and
a vertical drive configured to operate the probe in a vertical direction.

6. The resistivity measuring device of claim 5, wherein the measurement pattern is a measurement order configured to minimize a movement of an arm of the horizontal drive.

7. The resistivity measuring device of claim 4, wherein the controller is configured to be capable of prioritizing an order of rearrangement in an order of the radius, the angle, and the setting order.

8. The resistivity measuring device of claim 5, wherein the controller is configured to be capable of moving the probe to a measurement position of the object by the horizontal drive and bring the probe into contact with the object by the vertical drive to measure the object.

9. The resistivity measuring device of claim 8, wherein the controller is configured to be capable of determining whether or not the measurement position is a reference position, depending on a voltage value between a first probe of the plurality of probes and a second probe of the plurality of probes.

10. The resistivity measuring device of claim 9, wherein the controller is configured to be capable of setting the measurement position as the reference position when the voltage value between the first probe and the second probe is within a threshold value.

11. The resistivity measuring device of claim 9, wherein the controller is configured to be capable of lowering the probe again when the voltage value between the first probe and the second probe is outside of a threshold value.

12. The resistivity measuring device of claim 9, wherein the controller is configured to be capable of stopping measuring a resistivity when the voltage value between the first probe and the second probe is outside of a threshold value even when the act of lowering the probe again is performed a predetermined number of times.

13. The resistivity measuring device of claim 5, wherein the controller is configured to be capable of raising and lowering the vertical drive to adjust a push-in amount.

14. The resistivity measuring device of claim 5, wherein the vertical drive includes at least a probe mounting bracket having a predetermined weight, a motor, a vertical drive cam, and a cam receiver.

15. The resistivity measuring device of claim 4, further comprising: a rotation drive configured to rotate a table on which the object is placed,
wherein the measurement pattern is a measurement order configured so as to minimize a rotational operation of the table on which the object is placed.

16. The resistivity measuring device of claim 4, wherein the controller is configured to be capable of prioritizing an order of rearrangement in an order of the angle, the radius, and the setting order.

* * * * *